United States Patent
Lai

(10) Patent No.: US 9,093,502 B2
(45) Date of Patent: Jul. 28, 2015

(54) STRING SELECT LINE (SSL) OF THREE-DIMENSIONAL MEMORY ARRAY AND METHOD OF FABRICATING THE SAME

(71) Applicant: MACRONIX International Co., Ltd., Hsinchu (TW)

(72) Inventor: Erh-Kun Lai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 13 days.

(21) Appl. No.: 14/086,692

(22) Filed: Nov. 21, 2013

(65) Prior Publication Data

US 2015/0137250 A1 May 21, 2015

(51) Int. Cl.
| | | |
|---|---|---|
| G01R 31/26 | (2014.01) |
| H01L 21/66 | (2006.01) |
| H01L 21/3205 | (2006.01) |
| H01L 21/4763 | (2006.01) |
| H01L 21/44 | (2006.01) |
| H01L 29/76 | (2006.01) |
| H01L 21/768 | (2006.01) |
| H01L 21/28 | (2006.01) |
| H01L 29/49 | (2006.01) |

(52) U.S. Cl.
CPC .... *H01L 21/76877* (2013.01); *H01L 21/28008* (2013.01); *H01L 29/4916* (2013.01)

(58) Field of Classification Search
CPC .................. H01L 21/76877; H01L 21/28008; H01L 29/4916
USPC ...................... 257/314, 368; 438/16, 591, 660
See application file for complete search history.

(56) References Cited

U.S. PATENT DOCUMENTS

2011/0316064 A1* 12/2011 Kim et al. ..................... 257/314

* cited by examiner

*Primary Examiner* — David S Blum
(74) *Attorney, Agent, or Firm* — J.C. Patents

(57) ABSTRACT

The present invention further provides a string select line (SSL) of a three-dimensional memory array, including: a dielectric substrate; an SSL structure disposed on the dielectric substrate, wherein the SSL structure includes a plurality of dielectric layers and a plurality of first conductive layers, the dielectric layers and the first conductive layers stacked alternatively; a second conductive layer covering sidewalls and a top portion of the SSL structure; and an oxide layer disposed between the first conductive layers and the second conductive layer, and contacting with the first conductive layers and the second conductive layer.

15 Claims, 12 Drawing Sheets

STRING SELECT LINE (SSL) OF THREE-DIMENSIONAL MEMORY ARRAY AND METHOD OF FABRICATING THE SAME

BACKGROUND

1. Technical Field

The present invention is directed to a semiconductor device, and especially, to a string select line (SSL) of a three-dimensional memory array and the method of fabricating the same.

2. Description of Related Art

A non-volatile memory can maintain the stored data even after the power is off, and thus the non-volatile memory has become a mandatory memory in many electronic products, so as to ensure the normal operation when the electronic products are booted.

Together with the size reduction of electronic devices, dimensions of the memory containing memory cell arrays are decreased. However, the existing photolithography technology imposes restrictions on the size reduction of a normal two-dimensional memory cell array (e.g., reduction of the distance between adjacent memory cells).

A technique of stacking multiple films and then constructing memory cells are developed by researchers. This technique, the so-called "three-dimensional memory array," has a potential to achieve an immense storage capacity and a low cost per unit bit. Unfortunately, the process of forming the current three-dimensional memory cell array is rather complicated, and the size reduction of the three-dimensional memory cell array is still subject to the existing photolithography technology.

SUMMARY

The present invention provides a string select line (SSL) of a three-dimensional memory array and a method of fabricating the same which facilitate the control of the individual gates in the SSL, and prevent the situation where the gates in the SSL are programmed or erased.

In the present invention, the method of fabricating a string select line (SSL) of a three-dimensional memory array including the following steps. First, a dielectric substrate is provided, on which a stacked layer and a hard mask layer are formed in advance, wherein the stacked layer includes a plurality of dielectric layers and a plurality of first conductive layers, and the dielectric layers and the first conductive layers are stacked alternatively. The stacked layer further includes two first openings exposing the dielectric substrate, wherein a portion of the stacked layer between the first openings is used to form an SSL. The hard mask layer covers the stacked layer and has a second opening formed therein, wherein the second opening is disposed on the first openings and exposes the stacked layer between the first openings. Then, a heat treatment is performed to form an oxide layer on a sidewall of the portion of the stacked layer. Afterwards, a second conductive layer is formed in the first openings and the second opening, wherein the second conductive layer contacts with the oxide layer. Further, the stacked layer, the hard mask layer, and the second conductive layer are patterned so as to form the SSL and a bit line pattern, wherein the SSL includes the portion of the stacked layer and a portion of the second conductive layer covering the portion of the stacked layer.

In an embodiment, the formation of the oxide layer on the sidewall of the portion of the stacked layer includes forming the oxide layer on a sidewall of each of the first conductive layers in the portion of the stacked layer.

In an embodiment, the uppermost layer of the stacked layer is a dielectric layer.

In an embodiment, the second opening includes a first portion and a second portion having a same shape, and a third portion connecting the first portion and the second portion and exposing the stacked layer, the first portion and the second portion having a shape the same as each of the first openings.

In an embodiment, patterning the stacked layer includes performing a dry etch process having no selectivity to the dielectric layers and the first conductive layers.

In an embodiment, the formation of the second opening includes the following steps. A stacked material and a hard mask material are sequentially formed on the dielectric substrate to cover the entirety of the dielectric substrate. Then, two third openings are formed in the stacked material and the hard mask material so that the stacked layer having the first openings is formed. Afterwards, the hard mask material between the third openings is removed so that the hard mask layer having the second opening is formed.

In an embodiment, removing the hard mask material between the third openings includes the following steps. A material layer is formed on the dielectric substrate to fill the third openings and cover the hard mask material. Then, a patterned photoresist layer is formed on the material layer. Afterwards, a portion of the material layer and the hard mask material between the third openings are removed with the patterned photoresist layer used as a mask. Further, the remaining material layer is removed.

In an embodiment, the material layer includes an organic dielectric layer (ODL) and a silicon-rich polymer layer, wherein the organic dielectric layer fills the third openings and the silicon-rich polymer layer covers the entirety of the dielectric substrate.

In an embodiment, the dielectric layers include oxide.

In an embodiment, the first conductive layers include polysilicon.

In an embodiment, the second conductive layer includes polysilicon.

The present invention further provides a string select line (SSL) of a three-dimensional memory array, including: a dielectric substrate; an SSL structure disposed on the dielectric substrate, wherein the SSL structure includes a plurality of dielectric layers and a plurality of first conductive layers, the dielectric layers and the first conductive layers stacked alternatively; a second conductive layer covering the sidewalls and the top portion of the SSL structure; and an oxide layer disposed between the first conductive layers and the second conductive layer, and contacting with the first conductive layers and the second conductive layer.

In an embodiment, the uppermost layer of the SSL structure is a dielectric layer.

Accordingly, the present invention provides a novel method of fabricating a string select line (SSL) of a three-dimensional memory array, in which the fabrication process of the SSL and the fabrication process of the word line are separated, and a gate oxide is used as the gate dielectric layer of each of the gates in the SSL. As a result, $V_t$ is reduced, and each of the gates of the SSL is prevented from being undesirably programmed and erased.

In order to make the aforementioned and other objects, features and advantages of the present invention comprehensible, several non-limiting embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 10 illustrate a process flow of a method of fabricating a string select line (SSL) of a three-dimensional memory array according to the first embodiment of the present invention, wherein FIGS. 1A, 2A, 3A, 4A, 5A, 6A, 8A, 9, and 10A are top views of the various elements on the substrate, FIG. 7 is a partial enlarged view of portion 200 shown in FIG. 6B.

DESCRIPTION OF EMBODIMENTS

Figure 1A:
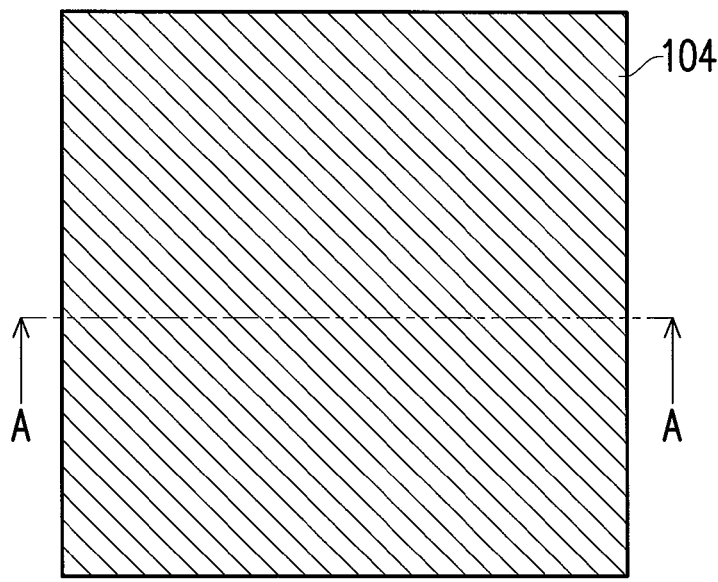

Reference will now be made in detail to the embodiments of the invention, examples of which are illustrated in the accompanying drawings. Wherever possible, the same reference numbers are used in the drawings and the description to refer to the same or like elements.

The first embodiment of the present invention provides a method of fabricating a string select line (SSL) of a three-dimensional memory array.

Figure 4A:
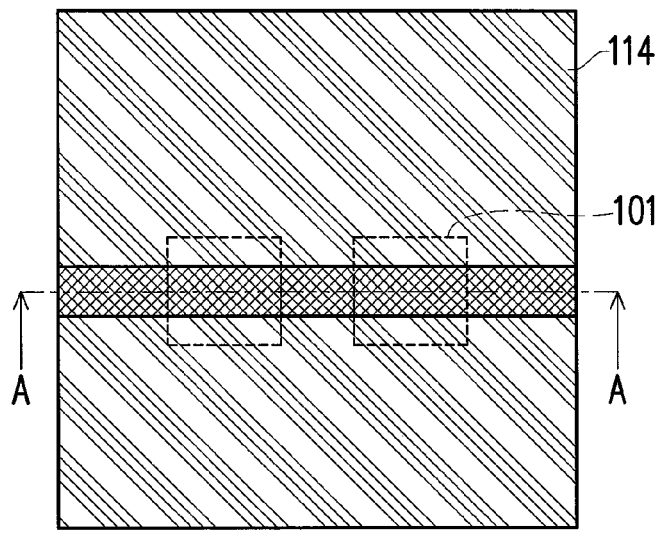
Figure 4B:
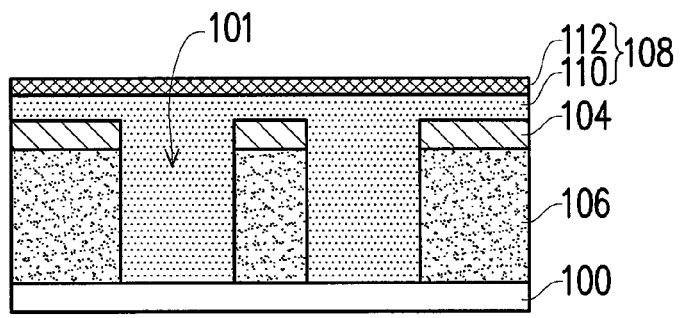
Figure 5A:
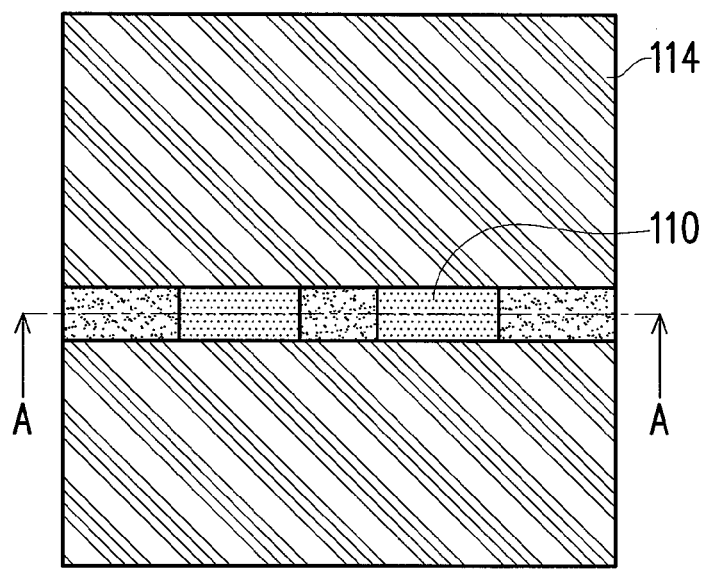
Figure 5B:
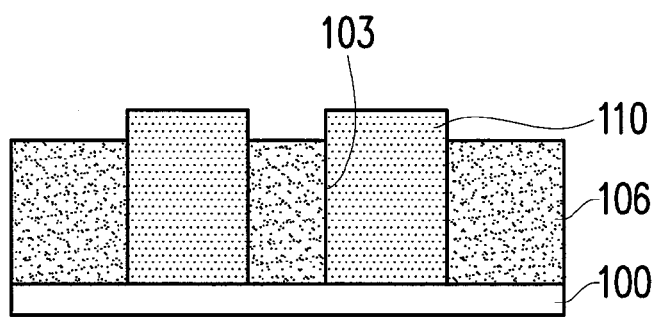
Figure 6A:
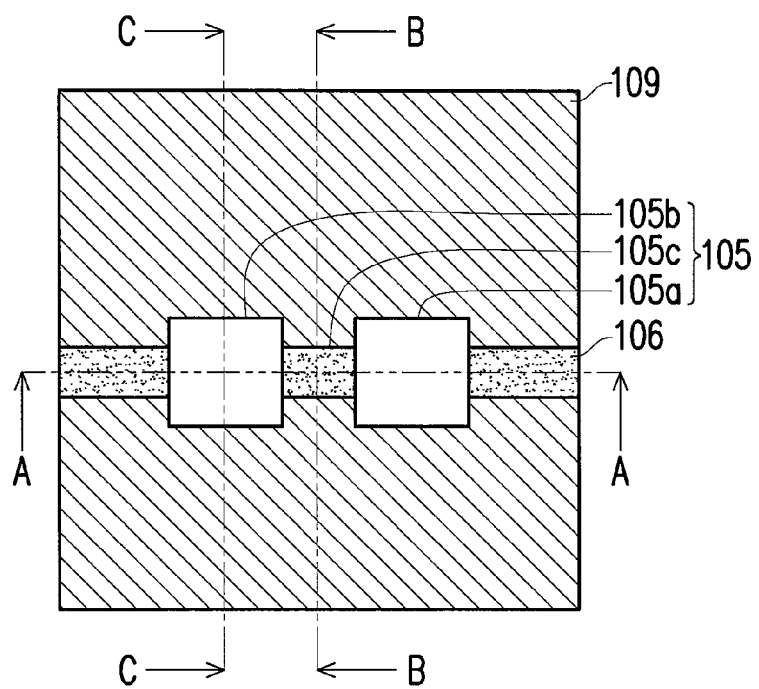
Figure 6B:
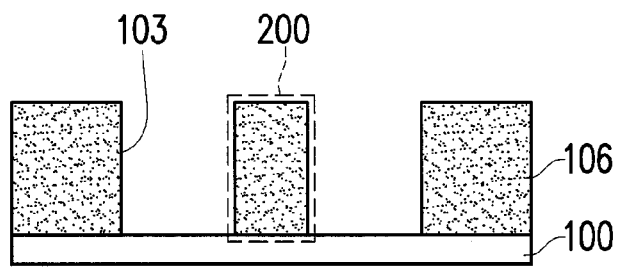
Figure 6C:
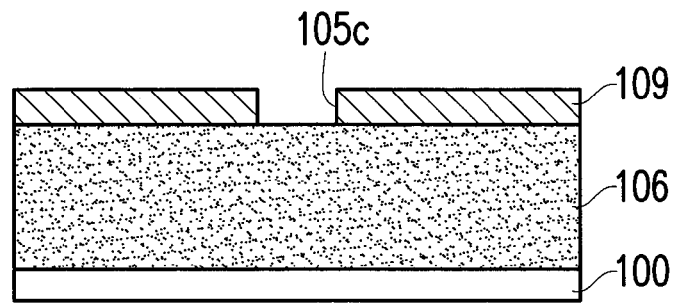
Figure 6D:
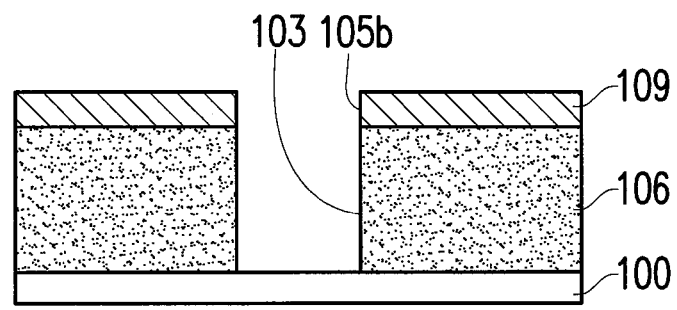
Figure 7:
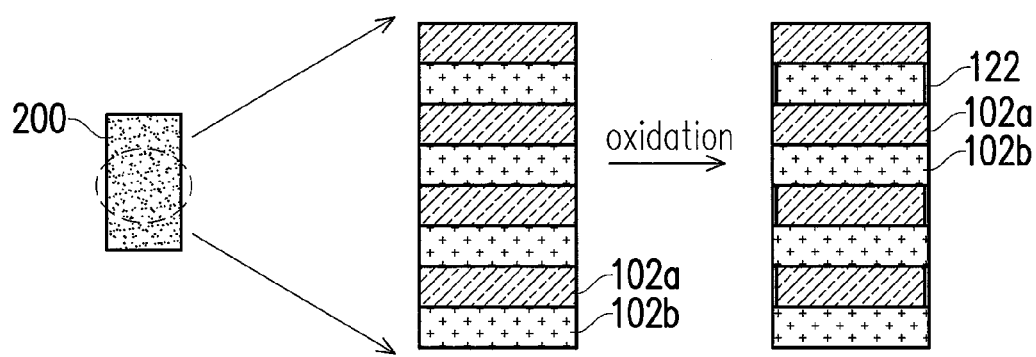
Figure 8A:
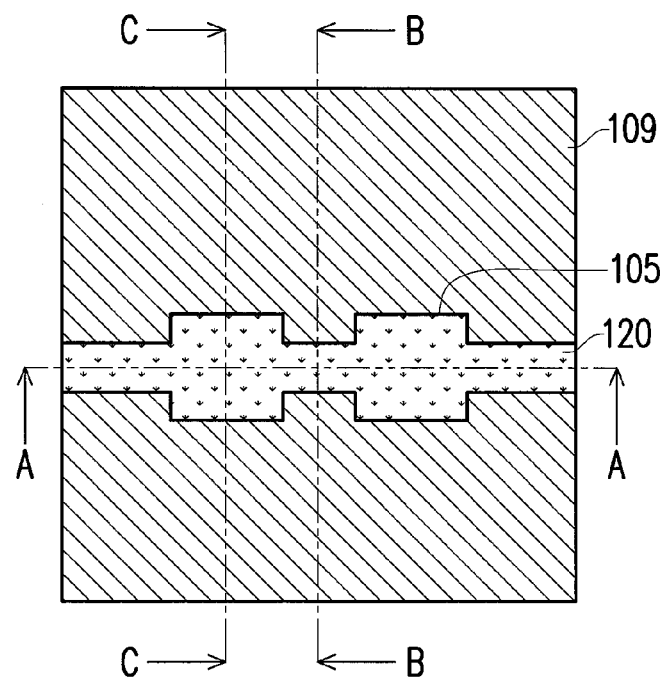

FIG. 1A to FIG. 10 illustrate a process flow of a method of fabricating a string select line (SSL) of a three-dimensional memory array according to the first embodiment of the present invention, wherein FIGS. 1A, 2A, 3A, 4A, 5A, 6A, 8A, 9, and 10A are top views of the various elements on the substrate, FIGS. 1A, 2A, 3A, 4A, 5A, 6A, 8A and 10A, FIGS. 6C and 8C are sectional views taken along the section line BB as respectively shown in FIGS. 6A and 8A, FIG. 6D and 8D are sectional views taken along the section line CC as respectively shown in FIGS. 6A and 8A, and FIG. 7 is a partial enlarged view of portion 200 shown in FIG. 6B.

Figure 1B:
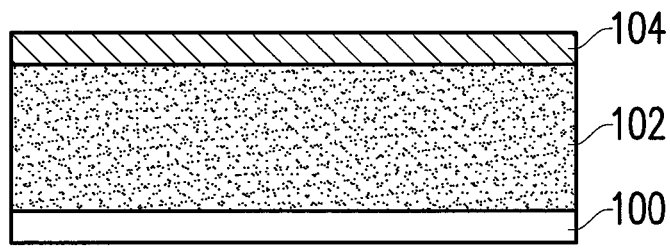
FIGS. 1B, 2B, 3B, 4B, 5B, 6B, 8B and 10B are sectional views taken along the section line AA as respectively shown in FIGS. 1A, 2A, 3A, 4A, 5A, 6A, 8A and 10A, FIGS. 6C and 8C are sectional views taken along the section line BB as respectively shown in FIGS. 6A and 8A, FIG. 6D and 8D are sectional views taken along the section line CC as respectively shown in FIGS. 6A and 8A.

The method of fabricating a string select line (SSL) of a three-dimensional memory array of the first embodiment includes the following steps. Referring to FIG. 1A and FIG. 1B which is a sectional view taken along the line AA of FIG. 1A, first, a dielectric substrate 100 is provided. The dielectric substrate 100 may include oxide, such as silicon oxide. A stacked material 102 and a hard mask material 104 are sequentially formed on the dielectric substrate 100 to cover, entirely, the dielectric substrate 100. While the stacked material 102 is shown as a single layer in FIG. 1B, it actually includes a plurality of dielectric layers 102a and a plurality of first conductive layers 102b stacked alternatively, which will be explained in more detail with reference to FIG. 7. For example, the number of the first conductive layers 102b may be four, eight, sixteen, or thirty two, and each of the dielectric layers 102a is disposed at the upper side or the lower side of one of the first conductive layers 102b. In an example, the uppermost layer of the stacked material 102 is a dielectric layer 102a. In another example, the lowermost layer of the stacked material 102 is also a dielectric layer 102a.

A dielectric layer 102a may include an oxide such as silicon oxide, while a first conductive layer 102b may include polysilicon. The hard mask material 104 may include a nitride such as silicon nitride. The present invention, however, is not limited thereto. For example, in other embodiments, the dielectric layer 102a may include a nitride or an oxynitride. The stacked material 102, i.e., the dielectric layers 102a and the first conductive layers 102b, and the hard mask material 104 are respectively formed by, for example, a chemical vapor deposition (CVD) process.

Figure 2A:
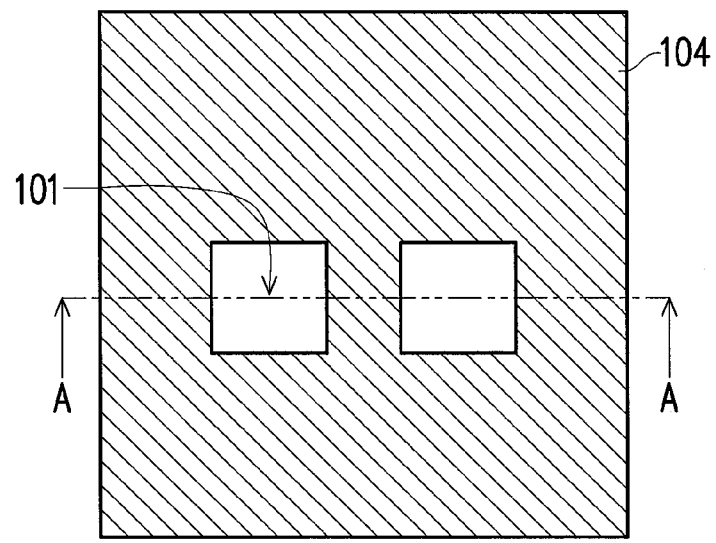
Figure 2B:
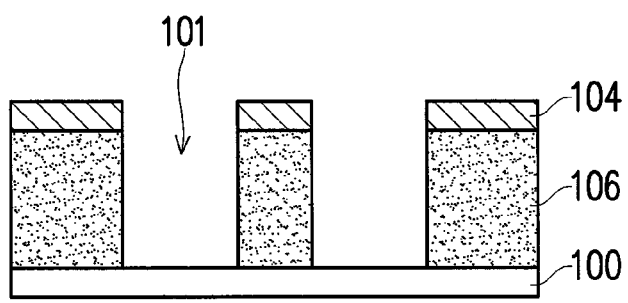

Referring to FIG. 2A and FIG. 2B which is a sectional view taken along the line AA of FIG. 2A, then, a portion of the stacked material 102 and a portion of the hard mask material 104 are removed to form a stacked layer 106 having a plurality of openings and form a plurality of openings in the hard mask material 104. Each of the openings formed in the stacked layer 106 and the corresponding one of the openings formed in the hard mask material 104 collectively form an opening 101 exposing the dielectric substrate 100. The stacked material 102 and the hard mask material 104 are respectively removed by, for example, a dry etch process.

Figure 3A:
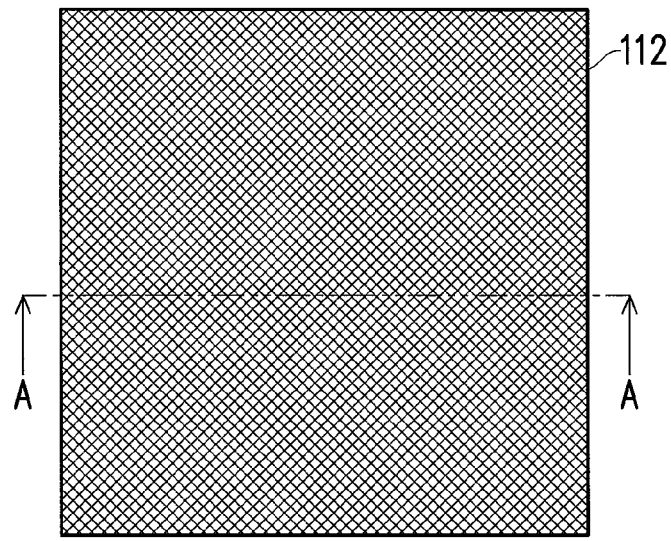
Figure 3B:
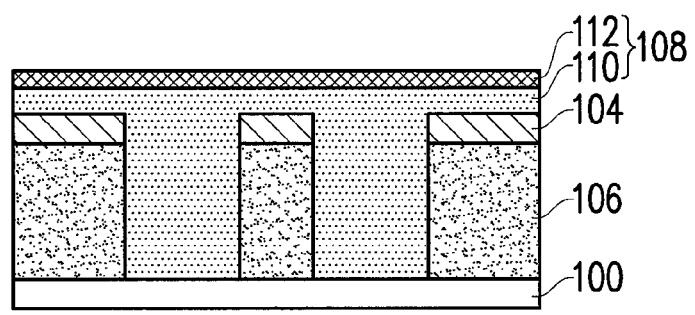

Referring to FIG. 3A and FIG. 3B which is a sectional view taken along the line AA of FIG. 3A, then, a material layer 108 is formed on the dielectric substrate 100 to fill the openings 101 and cover the entirety of the dielectric substrate 100. In particular, in this embodiment, the material layer 108 is a composite structure including an organic dielectric layer (ODL) 110 and a silicon-rich polymer layer 112. The organic dielectric layer 110 has an excellent gap-filling property and may readily fill the openings 101. The organic dielectric layer 110 is, for example, ODL-61 or ODL-50 provided by Shin-Etsu Chemical Co., Ltd. The silicon-rich polymer layer 112 is formed on the organic dielectric layer 110 to cover the entirety of the dielectric substrate 100 and may serve as a hard mask in the subsequent process. The silicon-rich polymer layer 112 is, for example, the "SHB" product provided by Shin-Etsu Chemical Co., Ltd.

Referring to FIG. 4A and FIG. 4B which is a sectional view taken along the line AA of FIG. 4A, then, a patterned photoresist layer 114 is formed on the material layer 108. The patterned photoresist layer 114 is formed by, for example, coating a photoresist material (not shown) on the dielectric substrate 100, and then patterning the photoresist material by exposure and development. It should be noted that the area through which the line AA of FIG. 4A passing is not occupied by the patterned photoresist layer 114, and thus the sectional views FIG. 4B and FIG. 3B are identical. To clearly present the spatial relationship between the patterned photoresist layer 114 and the openings 101, the openings 101 are marked by dotted lines in FIG. 4A.

Referring to FIG. 5A and FIG. 5B which is a sectional view taken along the line AA of FIG. 5A, then, a portion of the material layer 108 is removed with the patterned photoresist layer 114 used as a mask, and the hard mask material 104 between the openings 101 (referring back to FIG. 4A) is also removed. The material layer 108 and the hard mask material 104 may be removed respectively by a dry etch process such as a reactive ion etching (RIE) process. Further, if the uppermost layer of the stacked layer 106 is the dielectric layer 106a, that dielectric layer 106a is used as an etch stop layer in this dry etch process. After this dry etch process, the silicon-rich polymer layer 112 of the material layer 108 is completely removed, leaving a portion of the organic dielectric layer 110 remaining in the openings 103 of the stacked layer 106.

Referring to FIG. 6A and FIG. 6B, 6C, 6D which are sectional views taken along the line AA, line BB, and line CC of FIG. 6A, respectively, then, the patterned photoresist layer 114 is removed, and the remaining material layer 108, i.e., the remaining organic dielectric layer 110, is also removed. Consequently, the stacked layer 106 and a hard mask layer 109 are formed. The patterned photoresist layer 114 and the material layer 108 are removed respectively by, for example, a dry or wet photoresist stripping process and a dry or wet etch process.

As shown in FIGS. 6A to 6D, the stacked layer 106 has a plurality of (e.g., two) openings 103; the hard mask layer 109 has an opening 105. The openings 103 expose the dielectric substrate 100. Note that the portion of the stacked layer between the openings 103, i.e., the portion 200 marked by the square dotted frame, will be fabricated into an SSL in the subsequent process. The opening 105 is located on the openings 103 (referring to FIGS. 6A and 6D), and exposes the stacked layer 106 between the openings 103 (referring to FIG. 6C).

More specifically, referring to FIG. 6A, the opening 105 includes a first portion 105a and a second portion 105b, and a third portion 105c connecting the first portion 105a and the second portion 105b and exposing the stacked layer 106. The first portion 105a and the second portion 105b have a shape the same as each of the openings 103. Further, the first portion 105a and the second portion 105b are respectively aligned with one of the openings 103. Here, the "shape" refers to the shape as observed from the top views.

Referring back to FIG. 6B, as mentioned earlier, the portion 200 will be fabricated in to the SSL of the three-dimensional memory array, wherein each of the first conductive layers 102b is used as a gate. In this regard, a gate dielectric layer should be formed at least on each of the sidewalls of the portion 200. In a conventional fabrication process of a three-dimensional memory array, the SSL and the word line are formed at the same time, and thus the gate dielectric layer of a select gate and the "gate dielectric layer," i.e., the charge storage structure, of a memory cell are formed by a same deposition process; in other words, they are identical in material and dimension. A typical example is an oxide/nitride/oxide (ONO) film having a thickness of 100 Å to 300 Å. In this embodiment, however, the gate dielectric layer of the SSL may be formed by heat treatment instead of a deposition process, and it is a single-layer film having a thickness of 20 Å to 100 Å, 70 Å as typical. This is much less than the thickness of the conventional ONO structure. The gate dielectric layer in the SSL of the present embodiment is explained in detail with reference to FIG. 7.

FIG. 7 shows the portion 200 and a partial enlarged view thereof. Referring to FIG. 7, as mentioned earlier, the portion 200 includes a plurality of dielectric layers 102a and a plurality of first conductive layers 102b, wherein the dielectric layers 102a and the first conductive layers 102b are stacked alternatively. Then, a heat treatment (or, a thermal process) is performed to form an oxide layer 122 on each of the sidewalls of the portion 200. In particular, the oxide layers 122 are formed on the sidewalls of each of the first conductive layers 102b in the portion 200. For example, in an embodiment in which the first conductive layers 102b consist of polysilicon, the oxide layers 122 include silicon oxide. Further, in this embodiment, the dielectric layers 102a are not affect (i.e., the composition thereof does not changed) by the heat treatment. In addition, GOX (gate oxide) could be deposited by CVD or LPCVD (low pressure chemical vapor deposition) or HTO (high temperature oxide deposition) deposition.

Figure 8B:
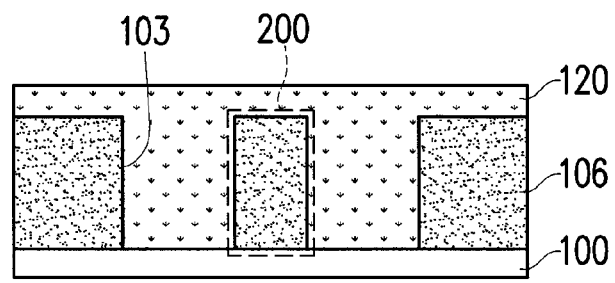
Figure 8C:
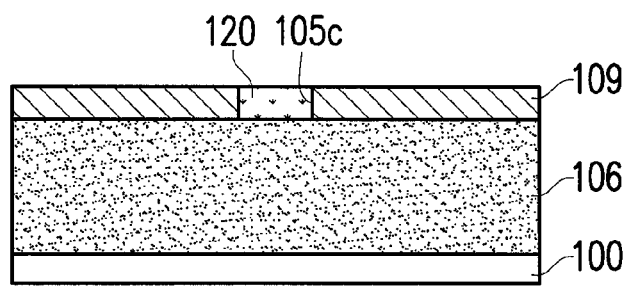
Figure 8D:
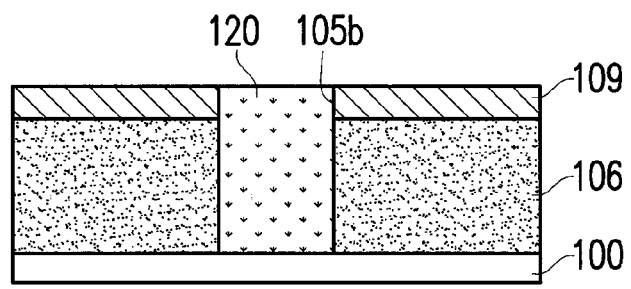

Referring to FIG. 8A and FIG. 8B, 8C, 8D which are sectional views taken along the line AA, line BB, and line CC of FIG. 8A, respectively, then, a second conductive layer 120 is formed in the openings 103 and the opening 105. Referring to FIG. 8B, in each of the openings 103, the second conductive layer 120 contacts with the stacked layer 106, that is, the second conductive layer 120 contacts with the oxide layer 122 of the portion 200 (referring to FIG. 7). The second conductive layer 120 may include polysilicon, and may be formed by, for example, a CVD process depositing a conductive material (not shown) which fills the openings 103 and the opening 105, and a subsequent chemical mechanical planarization (CMP) process using the hard mask layer 109 as a stop layer to remove the excess conductive material.

Figure 9:
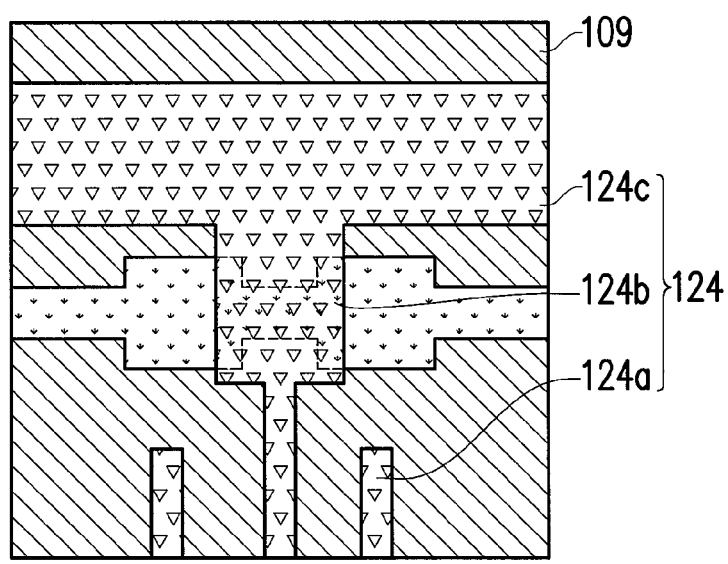

Referring to FIG. 9, then, a patterned photoresist layer 124 is formed on the dielectric substrate 100. The patterned photoresist layer 124 includes a first portion 124a defining a bit line pattern, a second portion 124b defining the SSL, and a third portion 124c defining a pad pattern. The patterned photoresist layer 124 is formed by a similar method used to forming the patterned photoresist layer 114 in FIG. 5A, and the details are omitted here for brevity.

Figure 10A:
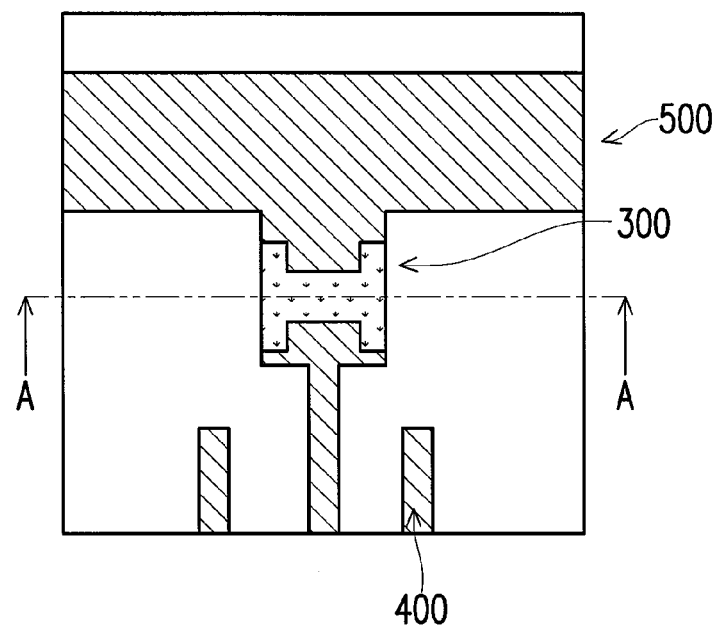
Figure 10B:
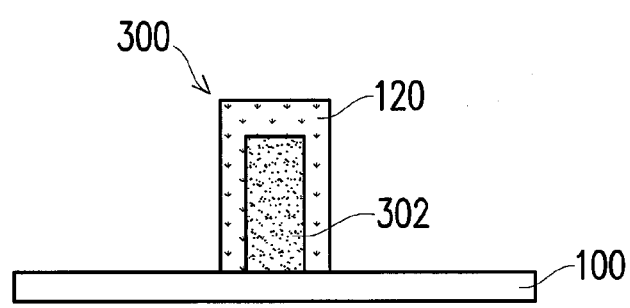

Referring to FIG. 10A and FIG. 10B which is a sectional view taken along the line AA of FIG. 10A, then, a portion of the stacked layer 106, a portion of the hard mask layer 109, and a portion of the second conductive layer 120 are removed to form an SSL 300, a bit line pattern 400, and a pad pattern 500. These materials are removed by, for example, a dry etch process (e.g., a RIE process) using the patterned photoresist layer 124 as a mask. It should be noted that, since the stacked layer 106 is formed by alternatively stacking the dielectric layers 102a and the first conductive layers 102b, this dry etch process is preferably a process having no selectivity to the dielectric layers 102a and the first conductive layers 102b, so as to ensure the resulted structure having a vertical profile.

The second embodiment of the present invention provides an SSL of a three-dimensional memory array as will be described with reference to FIG. 10B. The SSL 300 includes a dielectric substrate 100, an SSL structure 302 (i.e., the portion 200 as shown by FIG. 6B), the second conductive layer 120, and the oxide layer 122 (referring to FIG. 7). The SSL structure 300 is disposed on the dielectric substrate 100, and includes a plurality of dielectric layers 102a and a plurality of first conductive layers 102b stacked alternatively (referring to FIG. 7). The second conductive layer 120 covers the sidewalls and the top portion of the SSL structure 300. The oxide layer 122 is disposed between the first conductive layers 102b and the second conductive layer 120, and contacts with both of the first conductive layers 102b and the second conductive layer 120 (referring to FIG. 7).

In FIG. 10A, together with the SSL 300, the bit line pattern 400 is simultaneously formed. Then, a charge storage structure such as an ONO film or an ONONO film and a conductive material are sequentially formed on the bit line pattern 400, and, after the necessary patterning process, word lines of which the extension direction is perpendicular to the extension direction of the bit line pattern 400 are formed. The fabrication of the three-dimensional memory array is thus completed. The formation of the charge storage structure and the word lines are well-known to those who have ordinary skills in the art, and the details are therefore omitted for brevity.

It should be noted that, in the first embodiment, the SSL 300 and the bit line pattern 400 are formed at the same time, that is, prior to the formation of the word line. This is different to the conventional fabrication process of a three-dimensional memory array. In a conventional fabrication process of a three-dimensional memory array, the SSL and the word line are formed at the same time, and the gate dielectric of the gate in the SSL would be, for example, an ONO film. The problem lies in that, the SSL is used to switch between on/off states, and there is no need for the SSL to store charges. This is quiet different from the function of the word line. Thus, if the common ONO structure is used as the gate dielectric layer of the SSL, the SSL may be "programmed" or "erased" during the operation of the three-dimensional memory array. Moreover, the thickness of an ONO structure often lies in a range of 100 Å to 300 Å, leading to a high threshold voltage ($V_t$), which hinders the control of the individual gates in the SSL. All of these issues make the control of the memory array more difficult. Besides, the SSL is an "island" structure while the word line is a "strip" structure. If both of them are to be fabricated at the same time, it is required that two different patterns are formed on a single photomask, which also increases the complexity of the process.

Having recognized the above issues, the present invention provides a novel approach for fabricating an SSL of a three-dimensional memory array. The fabrication process of the SSL is separated from the fabrication process of the word line. A standard gate oxide is used as the gate dielectric in the SSL, resulting in a reduction of the thickness of the gate dielectric layer, and in turn, the reduction of $V_t$. Accordingly, the gates in the SSL are more easily to control, and the undesired situation where the gates of the SSL are inadvertently programmed or erased will be prevented because there is no charge storage structure in the SSL.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a string select line (SSL) of a three-dimensional memory array, comprising:
    providing a dielectric substrate, on which a stacked layer and a hard mask layer are formed, the stacked layer comprising a plurality of dielectric layers and a plurality of first conductive layers, wherein the dielectric layers and the first conductive layers are stacked alternatively, the stacked layer further comprising two first openings exposing the dielectric substrate, wherein a portion of the stacked layer between the first openings is used to form the SSL; the hard mask layer covers the stacked layer and has a second opening formed therein, wherein the second opening is disposed on the first openings and exposes the portion of the stacked layer;
    performing a heat treatment to form an oxide layer on a sidewall of the portion of the stacked layer;
    forming a second conductive layer in the first openings and the second opening, wherein the second conductive layer contacts with the oxide layer; and
    patterning the stacked layer, the hard mask layer, and the second conductive layer to form the SSL and a bit line pattern, wherein the SSL comprises the portion of the stacked layer and a portion of the second conductive layer covering the portion of the stacked layer.

2. The method of claim 1, wherein forming the oxide layer on the sidewall of the portion of the stacked layer comprising:
    forming the oxide layer on a sidewall of each of the first conductive layers in the portion of the stacked layer.

3. The method of claim 1, wherein an uppermost layer of the stacked layer is one of the dielectric layer.

4. The method of claim 1, wherein the second opening comprises a first portion and a second portion having a same shape, and a third portion connecting the first portion and the second portion and exposing the stacked layer, the first portion and the second portion having a shape the same as each of the first opening.

5. The method of claim 1, wherein patterning the stacked layer comprises performing a dry etch process having no selectivity to the dielectric layers and the first conductive layers.

6. The method of claim 1, wherein forming the second opening comprises:
    forming, sequentially, a stacked material and a hard mask material on the dielectric substrate to cover an entirety of the dielectric substrate;
    forming two third openings in the stacked material and the hard mask material so that the stacked layer having the first openings is formed; and
    removing the hard mask material between the third openings so that the hard mask layer having the second opening is formed.

7. The method of claim 6, wherein removing the hard mask material between the third openings comprises:
    forming, on the dielectric substrate, a material layer filling the third openings and covering the hard mask material;
    forming a patterned photoresist layer on the material layer;
    removing a portion of the material layer and the hard mask material between the third openings with the patterned photoresist layer used as a mask; and
    removing the remaining material layer.

8. The method of claim 7, wherein the material layer comprises an organic dielectric layer (ODL) and a silicon-rich polymer layer, the organic dielectric layer filling the third openings and the silicon-rich polymer layer covering an entirety of the dielectric substrate.

9. The method of claim 1, wherein the dielectric layers comprise oxide.

10. The method of claim 1, wherein the first conductive layers comprise polysilicon.

11. The method of claim 1, wherein the second conductive layer comprises polysilicon.

12. A string select line (SSL) of a three-dimensional memory array, comprising:
    a dielectric substrate;
    an SSL structure disposed on the dielectric substrate, wherein the SSL structure comprises a plurality of dielectric layers and a plurality of first conductive layers, the dielectric layers and the first conductive layers stacked alternatively;
    a second conductive layer covering sidewalls and a top portion of the SSL structure; and
    an oxide layer disposed between the first conductive layers and the second conductive layer, and contacting with the first conductive layers and the second conductive layer.

13. The string select line (SSL) of a three-dimensional memory array of claim 12, wherein an uppermost layer of the SSL structure is one of the dielectric layers.

14. The string select line (SSL) of a three-dimensional memory array of claim 12, wherein the first conductive layers comprise polysilicon.

15. The string select line (SSL) of a three-dimensional memory array of claim 12, wherein the second conductive layer comprises polysilicon.

* * * * *